United States Patent [19]
Kotecki et al.

[11] Patent Number: 5,796,573
[45] Date of Patent: Aug. 18, 1998

[54] OVERHANGING SEPARATOR FOR SELF-DEFINING STACKED CAPACITOR

[75] Inventors: David E. Kotecki, Hopewell Junction; William H. Ma, Fishkill, both of N.Y.

[73] Assignee: International Business Machines Corporation, Armonk, N.Y.

[21] Appl. No.: 865,533

[22] Filed: May 29, 1997

[51] Int. Cl.⁶ .................... H01G 4/06; H01G 4/20; H01G 4/10
[52] U.S. Cl. .................. 361/321.5; 361/311; 361/312; 361/313; 361/301.4; 257/303; 257/306
[58] Field of Search .................. 361/305, 303, 361/306.1, 301.4, 311, 312, 313, 321.1, 321.4, 321.5, 322, 512; 438/296, 295, 305, 306, 307, 240, 244, 247, 250, 251, 252, 253, 258, 239, 238; 257/295, 296, 301, 303, 306, 309, 310, 528, 532

[56] References Cited

U.S. PATENT DOCUMENTS

| | | | |
|---|---|---|---|
| 5,143,861 | 9/1992 | Turner | 438/256 |
| 5,335,138 | 8/1994 | Sandhu et al. | 361/303 |
| 5,346,844 | 9/1994 | Cho et al. | 438/253 |
| 5,381,302 | 1/1995 | Sandhu et al. | 361/305 |
| 5,392,169 | 2/1995 | Fazan et al. | 361/305 |
| 5,416,042 | 5/1995 | Beach et al. | 438/396 |
| 5,419,810 | 5/1995 | Brown et al. | 438/398 |
| 5,436,477 | 7/1995 | Hashizume et al. | 257/310 |
| 5,478,772 | 12/1995 | Fazan et al. | 438/396 |
| 5,489,548 | 2/1996 | Nishioka et al. | 438/396 |
| 5,504,041 | 4/1996 | Summerfelt | 438/396 |
| 5,506,166 | 4/1996 | Sandhu et al. | 438/396 |
| 5,534,458 | 7/1996 | Okudaira et al. | 438/240 |
| 5,550,076 | 8/1996 | Chen | 438/253 |
| 5,554,564 | 9/1996 | Nishioka et al. | 438/396 |

Primary Examiner—Bot L. Ledynh
Assistant Examiner—Anthony Dinkins
Attorney, Agent, or Firm—Alison D. Mortinger

[57] ABSTRACT

An overhanging separator structure with a post projecting from a surface which may be a substrate, an underlying layer on the surface, and a separator layer on the underlying layer, with the separator layer overhanging the underlying layer. A discontinuous film is then formed in a single process step having a first portion on the separator layer and a second portion on the post, the discontinuity caused by the overhanging separator layer. The structure is made into a stacked capacitor with the second (post) portion of the discontinuous film being the bottom electrode, by forming a continuous dielectric layer on the bottom electrode and a continuous top electrode layer on the dielectric layer.

22 Claims, 5 Drawing Sheets

1

OVERHANGING SEPARATOR FOR SELF-DEFINING STACKED CAPACITOR

RELATED APPLICATIONS

This invention is related to copending U.S. patent applications Ser. No. 08/865,528 titled "Overhanging Separator for Self-Defining Discontinuous Film", Ser. No. 08/865,534 titled "Adherent Separator for Self-Defining Discontinuous Film", and Ser. No. 08/865,529 titled "Trench Separator for Self-Defining Discontinuous Film", all filed on the same day and assigned to the present assignee.

FIELD OF THE INVENTION

This invention is directed to semiconductor films and the manufacture of the same, more particularly to a self-defining discontinuous film, and most particularly to a capacitor employing a self-defining bottom electrode.

BACKGROUND OF THE INVENTION

Stacked capacitor structures using high-dielectric materials such as $(Ba,Sr)TiO_3$ (BST) require noble metal electrodes, such as platinum, which are very difficult to pattern using conventional semiconductor processing such as reactive ion etching (RIE), ion beam etching, or chemical-mechanical polishing (CMP). Therefore there is a need for a capacitor structure which does not require a separate patterning step to define the electrodes.

For purposes of this invention, the term "oxide" layer is used generally to refer to a layer of silicon dioxide, and the silicon dioxide may be undoped or doped, for example, with boron, phosphorous, or both, to form for example borophosphosilicate glass (BPSG), and phosphosilicate glass (PSG). The silicon dioxide layers may be grown or deposited by conventional techniques.

SUMMARY OF THE INVENTION

It is therefore an object of the present invention to provide a capacitor structure which does not require a separate patterning step to define the electrodes.

It is a further object to provide a structure which is useful for forming a discontinuous film in one process step.

It is a further object to provide such a structure which is feasible for routine manufacturing.

In accordance with the above listed and other objects, an overhanging separator structure is provided with a post projecting from a surface which may be a substrate, an underlying layer on the surface, the underlying layer having a first opening formed therein such that the post is within the first opening and at least a first distance from the underlying layer, and a separator layer on the underlying layer, the separator layer having a second opening formed therein such that the post is within the second opening and at least a second distance from the separator layer, the separator layer overhanging the underlying layer. A nonpatterned discontinuous film can then be formed having a first portion on the separator layer and a second portion on the post, the discontinuity substantially in register with the second opening.

The structure is made into a stacked capacitor with the second (post) portion of the discontinuous film being the bottom electrode, by forming a dielectric layer on the bottom electrode and a continuous top electrode layer on the dielectric layer.

BRIEF DESCRIPTION OF THE DRAWINGS

These and other features, aspects, and advantages will be more readily apparent and better understood from the following detailed description of the invention, in which:

2

Figure 1A:
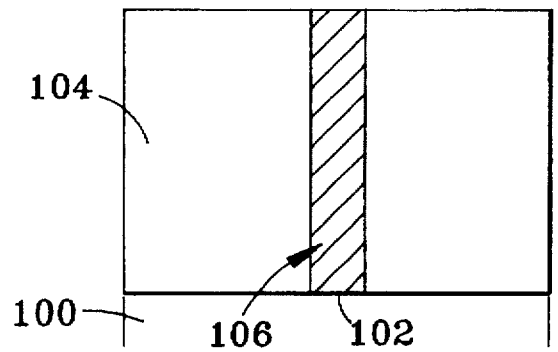
Figure 1B:
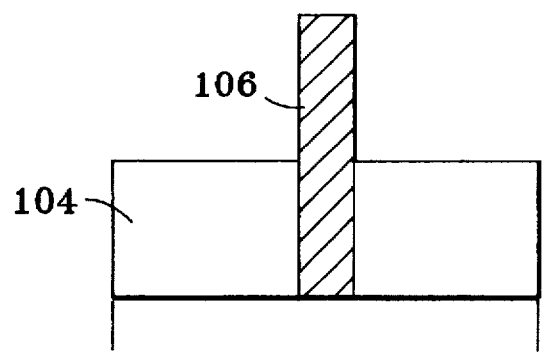
Figure 1C:
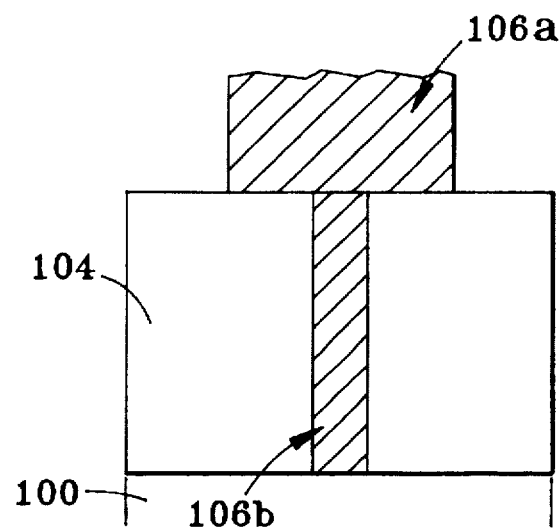
Figure 1D:
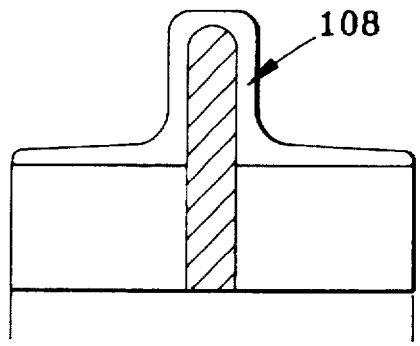
Figure 1E:
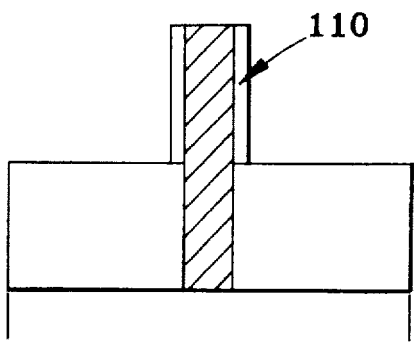
Figure 1F:
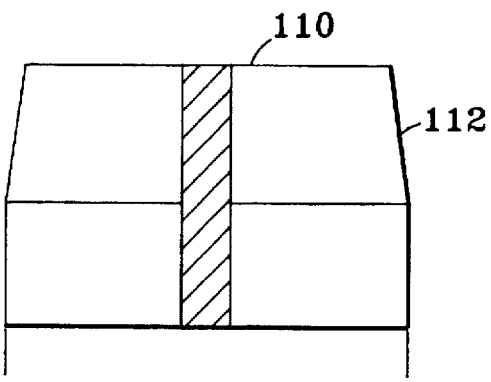
Figure 1G:
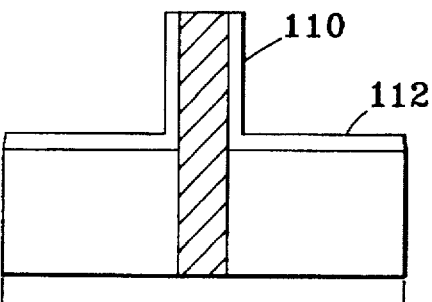
Figure 1H:
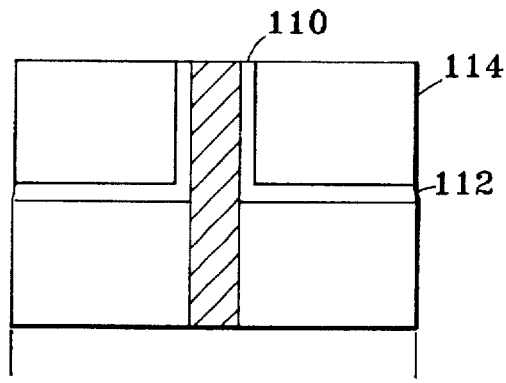
Figure 1I:
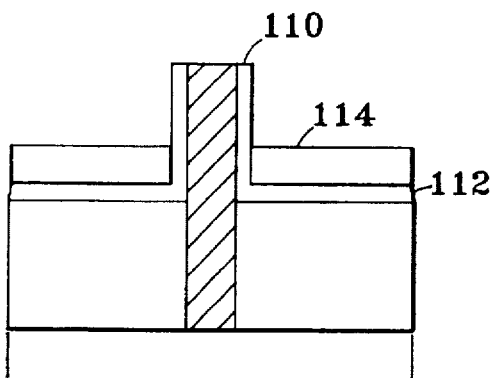
Figure 1J:
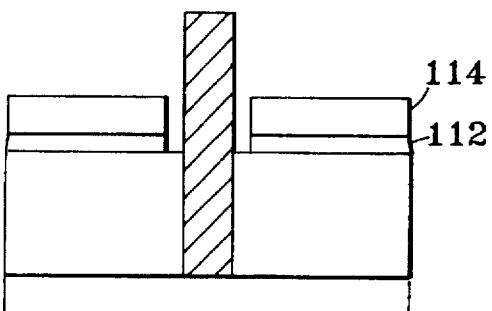
Figure 1K:
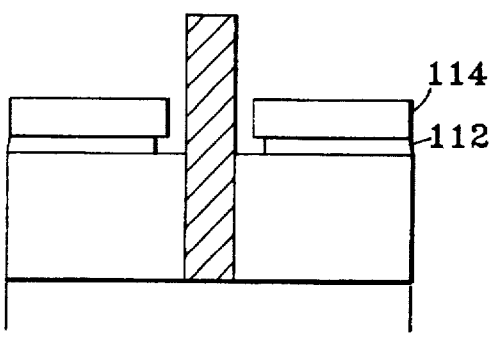
Figure 1L:
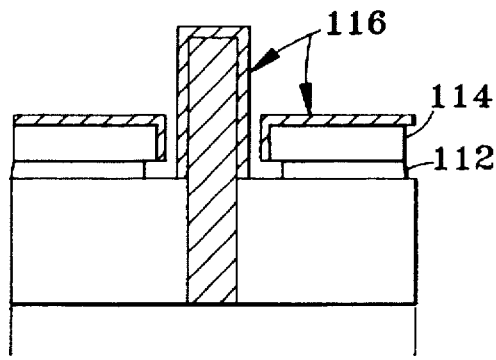
Figure 1M:
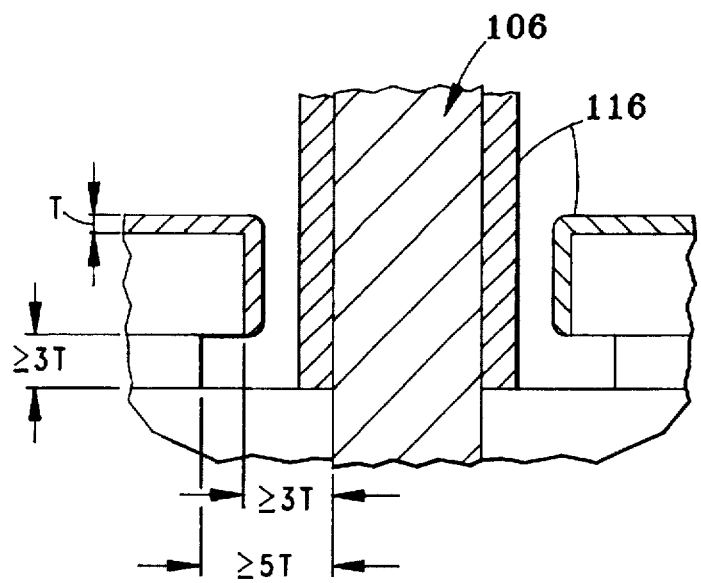
Figure 1N:
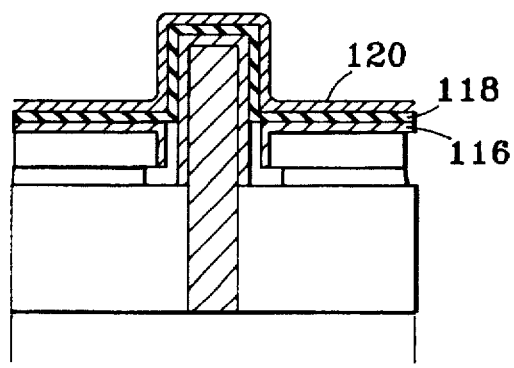

FIGS. 1a–1n are sectional views of the processing steps to manufacture the capacitor structure; and FIGS. 2a–2e are sectional views of alternate steps to those shown in FIGS. 1d–1k, all in accordance with the present invention.

DESCRIPTION OF THE PREFERRED EMBODIMENTS

The present invention is described herein in the context of a stacked capacitor merely as a specific example, and is not meant to limit applicability of the invention to such. Those skilled in the art will understand that the invention is broadly applicable to any structure or method in which it is desirable to have a self-defining discontinuous film structure with a post projecting from a surface, an underlying layer on the surface, the underlying layer having a first opening formed therein such that the post is within the first opening and at least a first distance from the underlying layer, and a separator layer on the underlying layer, the separator layer having a second opening formed therein such that the post is within the second opening and at least a second distance from the separator layer, the separator layer overhanging the underlying layer. A non-patterned discontinuous film may then be formed having a first portion on the separator layer and a second portion on the post, the discontinuity substantially in register with the second opening.

In FIG. 1a, a substrate 100 with a contact region 102 has formed thereon a layer of oxide 104. Note that for certain applications of the capacitor structure to be formed, other circuit elements such as word line and bit line contacts may be fabricated prior to and below the capacitor, within substrate 100 or oxide 104. Oxide 104 has been patterned by forming a hole extending down to contact region 102. A conductive material, for example in-situ doped polysilicon, tungsten, titanium, or various suicides including tungsten and titanium silicides, was then deposited for example by low pressure chemical vapor deposition (LPCVD) or sputtering followed by planarization to form post 106. Oxide 104 is then recessed so that post 106 is projecting from oxide 104 as shown in FIG. 1b. Note that post 106 may or may not have a portion below the oxide surface; both are within the scope of the term "projecting from." For structural strength, it is preferable to have a portion below the surface.

Alternatively, post 106 can be formed of more than one material in a multi-stage deposition process, resulting in an exemplary structure shown in FIG. 1c with a first portion 106a below the oxide surface and a second portion 106b on top of the first.

In FIG. 1d, a disposable layer 108 is formed over post 106 and oxide 104 and patterned for example by reactive ion etching (RIE) to form a disposable sidewall spacer 110 in FIG. 1e. Underlying layer 112 is then deposited and planarized as shown in FIG. 1f, and etched back in FIG. 1g. Separator layer 114 is deposited and planarized in FIG. 1h, and also etched back in FIG. 1i. Disposable sidewall spacer 110 is then removed in FIG. 1j by a selective process, either wet or dry, and in FIG. 1k underlying layer 112 is recessed with respect to separator layer 114 for example by a selective wet etch.

Disposable layer 108 may be formed from any material that is selectively removable with respect to underlying layer 112, separator layer 114, and post 106. Underlying layer 112 may be formed from any material which is selectively etchable with respect to separator layer 114 and post 106. For example, disposable layer 108 may be an oxide or a nitride, with an underlying layer 112 and separator layer 114 of nitride, oxide, polysilicon, or polyimide.

With overhanging separator 114 complete, formation of the stacked capacitor can begin as shown in FIG. 1*l*. A bottom electrode layer 116 is deposited in a single process step for example by a sputter process or CVD, which can be made more directional for example by collimation. Bottom electrode 116 may be for example Pt, Ir, Pd, or $IrO_2$ and is preferably a noble metal or noble metal oxide for high dielectric constant capacitor applications. It is important to note that bottom electrode layer 116 is discontinuous, and that the discontinuity is caused by separator 114. Layer 116 can also be characterized as non-patterned, or discontinuous-as-deposited. Therefore adjacent capacitors are prevented from shorting together. Thus the bottom electrode is self-forming or self-defining.

Optimally, with a non-directional deposition process for layer 116, separator 114 is a distance away from post 106 greater than or equal to three times the thickness T of layer 116. Underlying layer 112 is a distance away from post 106 greater than or equal to 5T, i.e. separator 114 overhangs underlying layer 112 by about 2T. Underlying layer 112 optimally has a thickness greater than or equal to 3T. This relationship is shown in FIG. 1*m*. The use of a more directional deposition process for layer 116 will enable less restrictive dimensions, i.e. less of an overhang and a thinner underlying layer, for example half the directional dimensions.

The capacitor is completed in FIG. 1*n* by depositing a dielectric layer 118 followed by a top electrode layer 120. Layers 118 and 120 are deposited by sputtering or CVD, for example. Dielectric 118 is any suitable capacitor dielectric, and is preferably a high-dielectric constant material (i.e. with a dielectric constant over 20) such as $(Ba,Sr)TiO_3$ (BST). Top electrode 120 is preferably from the same group of materials as bottom electrode 116.

Figure 2D:
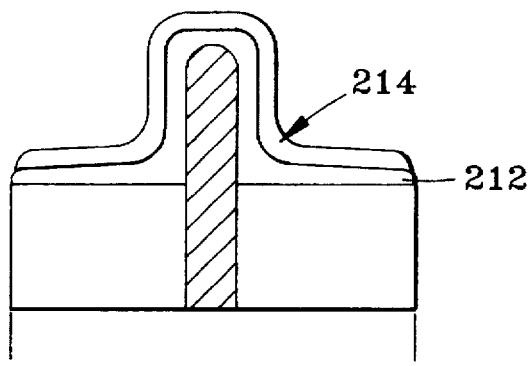
Figure 2G:
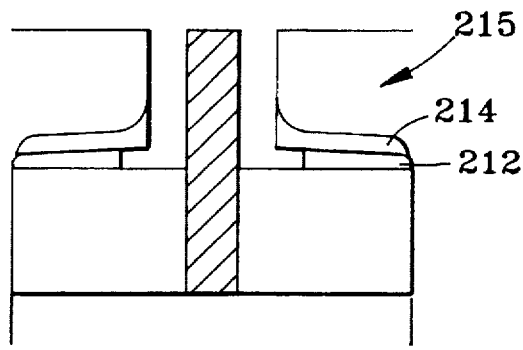
Figure 2E:
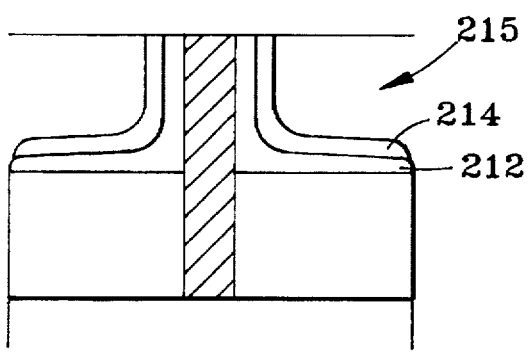
Figure 2H:
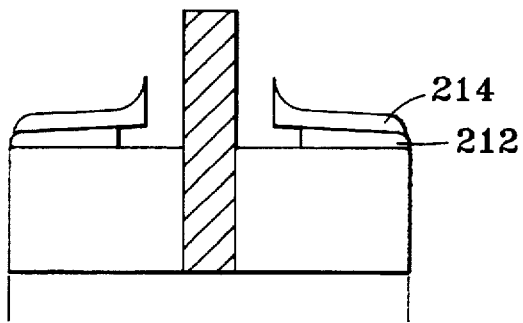
Figure 2F:
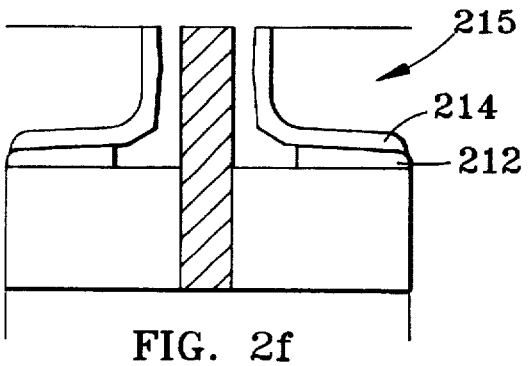

An alternate method to that shown in FIGS. 1*d*–1*k* of forming the underlying and separator layers is shown in FIGS. 2*a*–2*e*. In FIG. 2*a*, conformal underlying layer 212 and conformal overhanging layer 214 are sequentially deposited for example by chemical vapor deposition (CVD). A disposable material 215 is then deposited and the resulting structure is planarized as shown in FIG. 2*b*. In FIG. 2*c*, underlying layer 212 is etched by a suitable selective process, either wet or dry, followed by a similar selective etching of overhanging layer 214 in FIG. 2*d*. Layers 212 and 214 could be etched in the same step if they are made of materials which can be etched using a etchant with a suitable selectivity ratio. Disposable layer 215 is then removed, resulting in the structure shown in FIG. 2*e*. Creation of the discontinuous film and stacked capacitor follows as shown in FIGS. 1*l*–1*n*.

In summary, a capacitor structure is provided which does not require a separate patterning step to define the bottom electrode. More generally, a structure is provided which is useful for forming a discontinuous film in one process step, and is thus feasible for routine semiconductor manufacturing.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. An overhanging separator structure useful for creating a self-formed discontinuous film, comprising:

a post projecting from a surface;

an underlying layer on the surface, the underlying layer having a first opening formed therein such that the post is within the first opening and at least a first distance from the underlying layer; and a separator layer on the underlying layer, the separator layer having a second opening formed therein such that the post is within the second opening and at least a second distance from the separator layer, the second distance greater than zero, and the underlying layer recessed with respect to the separator layer.

2. The structure of claim 1, further comprising a non-patterned discontinuous film having a first portion on the separator layer and a second portion on the post, the non-patterned discontinuous film having a discontinuity substantially in register with the second opening.

3. The structure of claim 2 wherein the structure is a capacitor, and the discontinuous film is a bottom electrode of the capacitor, further comprising:

a dielectric layer on the bottom electrode; and a continuous top electrode layer on the dielectric layer.

4. The structure of claim 3 wherein the post is conductive.

5. The structure of claim 4 wherein the post is doped polysilicon.

6. The structure of claim 1 wherein the underlying layer is a material selected from the group consisting of oxide, nitride, polysilicon, and polyimide.

7. The structure of claim 1 wherein the underlying layer is an oxide.

8. The structure of claim 1 wherein the separator layer is a material selected from the group consisting of insulators and semiconductors.

9. The structure of claim 1 wherein the separator layer is an insulator.

10. The structure of claim 9 wherein the separator layer is an oxide.

11. The structure of claim 9 wherein the separator layer is a nitride.

12. The structure of claim 9 wherein the separator layer is a material selected from the group consisting of undoped $SiO_2$, doped $SiO_2$, SiN, and diamond-like carbon.

13. The structure of claim 3 wherein the bottom electrode is a material selected from the group consisting of noble metals and noble metal oxides.

14. The structure of claim 13 wherein the bottom electrode is platinum.

15. The structure of claim 3 wherein the dielectric layer is a high-dielectric constant material.

16. The structure of claim 15 wherein the dielectric layer is $(Ba,Sr)TiO_3$.

17. The structure of claim 2 wherein the first distance is at least equal to 2.5 times a thickness of the discontinuous film.

18. The structure of claim 17 wherein the first distance is at least equal to 5 times the thickness of the discontinuous film.

19. The structure of claim 2 wherein the underlying layer has a thickness at least equal to 1.5 times the thickness of the discontinuous film.

20. The structure of claim 19 wherein the underlying layer has a thickness at least equal to 3 times the thickness of the discontinuous film.

21. The structure of claim 2 wherein the second distance is at least equal to 1.5 times the thickness of the discontinuous film.

22. The structure of claim 21 wherein the second distance is at least equal to 3 times the thickness of the discontinuous film.

* * * * *